United States Patent
Hardikar

(10) Patent No.: US 7,422,700 B1
(45) Date of Patent: Sep. 9, 2008

(54) COMPOSITIONS AND METHODS OF ELECTROCHEMICAL REMOVAL OF MATERIAL FROM A BARRIER LAYER OF A WAFER

(75) Inventor: Vishwas Hardikar, Tempe, AZ (US)

(73) Assignee: Novellus Systems, Inc., San Jose, CA (US)

( * ) Notice: Subject to any disclaimer, the term of this patent is extended or adjusted under 35 U.S.C. 154(b) by 197 days.

(21) Appl. No.: 11/169,952

(22) Filed: Jun. 28, 2005

(51) Int. Cl.
*H01L 21/31* (2006.01)
(52) U.S. Cl. ............... 252/79.4; 438/693; 205/674; 205/684
(58) Field of Classification Search .......... 438/693; 205/668, 674, 684; 252/79.4
See application file for complete search history.

(56) References Cited

U.S. PATENT DOCUMENTS 7,128,825 B2 * 10/2006 Liu et al. ............... 205/668
2005/0092620 A1  5/2005 Mavliev et al.

* cited by examiner

*Primary Examiner*—Alexander G Ghyka
(74) *Attorney, Agent, or Firm*—Ingrassia Fisher & Lorenz, P.C.

(57) ABSTRACT

Methods and compositions have been provided for removing barrier layer material from a work piece during an electrochemical mechanical polishing process while protecting a metallization layer of the work piece. The electrochemical planarization composition includes at least one complexing agent capable of complexing with the barrier layer material when exposed to a pH outside of a pH range of greater than about pH 2 and less than about pH 10, a corrosion inhibitor, abrasive particles, and a pH adjuster.

10 Claims, 4 Drawing Sheets

COMPOSITIONS AND METHODS OF ELECTROCHEMICAL REMOVAL OF MATERIAL FROM A BARRIER LAYER OF A WAFER

FIELD OF THE INVENTION

The present invention generally relates to semiconductor fabrication, and more particularly relates to compositions and methods utilized for planarizing a semiconductor work piece.

BACKGROUND OF THE INVENTION

Typically during a fabrication process of an integrated circuit, a semiconductor wafer is subjected to various processes for depositing multiple layers of dielectric and conductive materials onto the wafer. After deposition, the multiple layers are wired together or interconnected to form the integrated circuit. Typically, the "wiring" of an integrated circuit involves pattern etching of features, such as trenches and "vias," in the dielectric material and filling the features with the conductive material.

Copper has been used as the conductive material for forming conductive contacts and interconnects because of its relatively low susceptibility to electromigration and low resistivity. However, because copper does not readily form volatile or soluble compounds, patterned etching of copper is difficult. Thus, the copper conductive contacts and interconnects are formed using a damascene process.

In accordance with a typical damascene process, the copper conductive contacts and interconnects are formed by creating a via within an insulating material. A barrier layer is deposited onto the surface of the insulating material and into the via. The barrier layer prevents contamination caused by copper diffusing through the interlayer dielectrics and may be formed of any suitable material, such as, for example, tantalum (Ta) and/or tantalum nitride (TaN). Next, a seed layer of copper is deposited over the barrier layer. Then, a copper metallization layer is electrodeposited over the seed layer to fill the via. Excess copper from the metallization layer and the seed layer and excess Ta and/or TaN from the barrier layer overlying the insulating material outside the via are then removed by a chemical mechanical planarization process.

Chemical mechanical planarization, also known as chemical mechanical polishing (referred to herein collectively as "CMP"), is a technique that has been conventionally used for the planarization of semiconductor wafers. CMP also is often used in the formation of microelectronic devices to provide a substantially smooth, planar surface suitable for subsequent fabrication processes such as photoresist coating and pattern definition. A typical CMP apparatus suitable for planarizing a semiconductor surface generally includes a wafer carrier configured to support, guide, and apply pressure to a wafer during the polishing process, a polishing compound such as a slurry to assist in the removal of material from the surface of the wafer, and a polishing surface such as a polishing pad. In addition, the polishing apparatus may include an integrated wafer cleaning system and/or an automated load/unload station to facilitate automatic processing of the wafers.

A wafer surface is generally polished by moving the surface of the wafer to be polished relative to the polishing surface in the presence of the slurry. In particular, the wafer is placed in the carrier such that the surface to be polished is placed in contact with the polishing surface, and the polishing surface and/or the wafer are moved relative to each other while slurry is supplied to the polishing surface.

Although chemical mechanical planarization processes effectively remove materials from the metallization, seed, and barrier layers, these processes may have some drawbacks. For example, mechanical polishing may inadvertently damage the metallization and/or seed layers or may leave stresses in the wafer leading to subsequent cracking and shorting between the layers. Furthermore, the CMP process may result in sheering or crushing of fragile layers, such as layers made of low dielectric constant materials. In circumstances in which the barrier layer comprises Ta and/or Ta/N, this drawback may become even more pronounced. Generally, Ta and/or Ta/N are relatively harder to remove from a semiconductor wafer than the materials of a metallization or a seed layer. Thus, a relatively high force may need to be exerted by the polishing surface against the barrier layer, which may undesirably leave stresses in the underlying layer made of low dielectric constant material. The CMP process, further, due to its dependence on high pressures, oxidizing agents and pad bending, also may tend to cause dishing in the center of wide metal features, such as trenches and vias, oxide erosion between metal features, and dielectric oxide loss.

Accordingly, it is desirable to have a method and compositions for use in the method that remove material from the barrier layer, metallization layer, and seed layer without damaging the metallization and/or seed layer and/or the dielectric layer. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The term "chemical mechanical planarization" is often referred to in the industry as "chemical mechanical polishing," and it is intended to encompass herein both terms by the use of "chemical mechanical planarization" and to represent each by the acronym "CMP." Additionally, the term "electrochemical planarization" is often referred to in the industry as "electropolishing" and it is intended to encompass herein "electropolishing" and "electrochemical mechanical planarization". "Electrochemical mechanical planarization" may be represented by the acronym "ECMP" and is intended to encompass both electrochemical mechanical polishing and electrochemical mechanical planarization. "Planarization" refers to CMP, ECMP, and electrochemical planarization. The invention is not limited to the embodiments illustrated herein; instead, the invention is applicable to a variety of processing apparatus and to the processing of many types of semiconductor work pieces having various layers deposited thereon.

Figure 1:
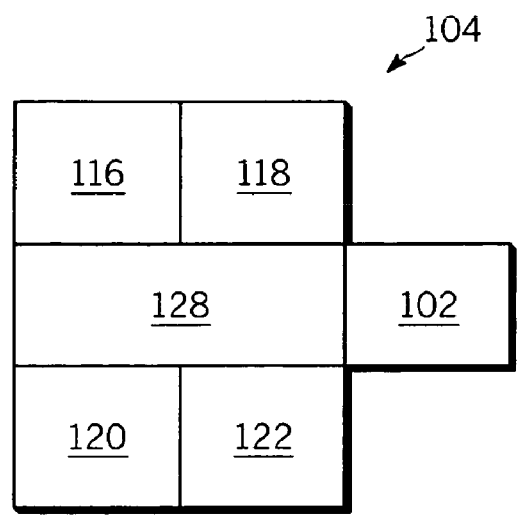
FIG. 1 is a schematic of a conventional planarization apparatus.

FIG. 1 schematically depicts a conventional planarization apparatus 100. Planarization apparatus 100 generally includes at least a work piece load/unload station 102 and a multi-station polishing system 104. Load/unload station 102 is configured to transport a work piece to multi-station polishing system 104. Polishing system 104 is configured to polish a work piece that is transferred thereto and may include one or more, preferably four polishing stations 116, 118, 120, and 122, and a robot 128 configured to transport the work piece between polishing stations 116, 118, 120, and 122. Each polishing station 116, 118, 120, and 122 is configured to operate independently from one another and may be configured to a CMP process, an ECMP process, or an electrochemical polishing process. It will be appreciated that each polishing station 116, 118, 120, and 122 may be configured to perform different processes, or alternatively, two or more of polishing stations 116, 118, 120, and 122 may be configured to perform the same processes.

Figure 2:
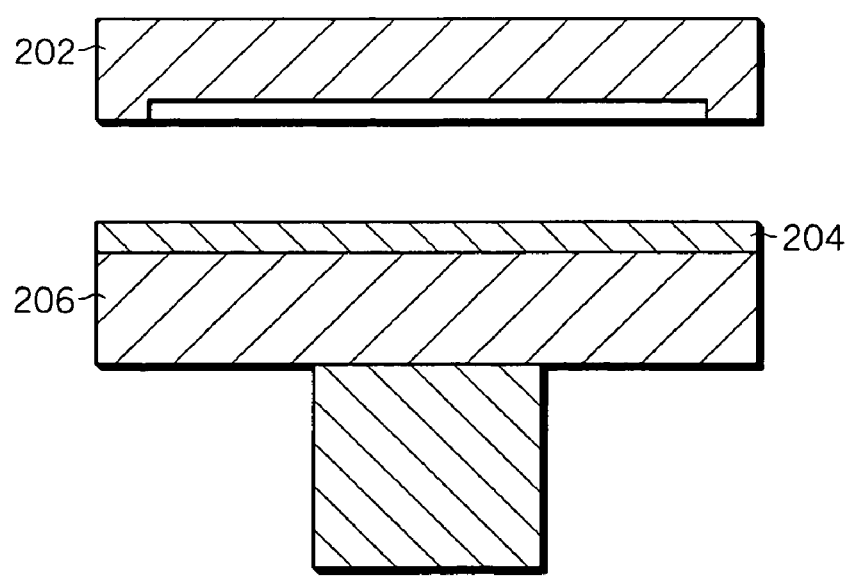
FIG. 2 is a cross section of a simplified conventional CMP polishing station.

Referring to FIG. 2, a conventional polishing station 200 capable of performing a CMP process may be implemented in planarization apparatus 100. Polishing station 200 includes a wafer carrier 202, a polishing surface 204, and a platen 206. Wafer carrier 202 carries a work piece by any method known in the industry, such as, for example, vacuum suction or suitable wafer grippers, and may be configured to move a work piece relative to polishing surface 204 or to urge the work piece against polishing surface 204. Polishing surface 204 is mounted on platen 206 and may comprise any suitable contact surface used to impart pressure on a surface of a work piece to facilitate the planarization thereof. Platen 206 may be configured to move polishing surface 204 in an orbital, linear or oscillatory pattern or any combination thereof. A CMP composition, such as a CMP slurry may be administered to the work piece during a polishing process. It will be appreciated that the CMP composition may be delivered to the work piece in any conventional manner, such as, for example, through the polishing surface 204 or onto the surface of the polishing surface 204.

Figure 3:
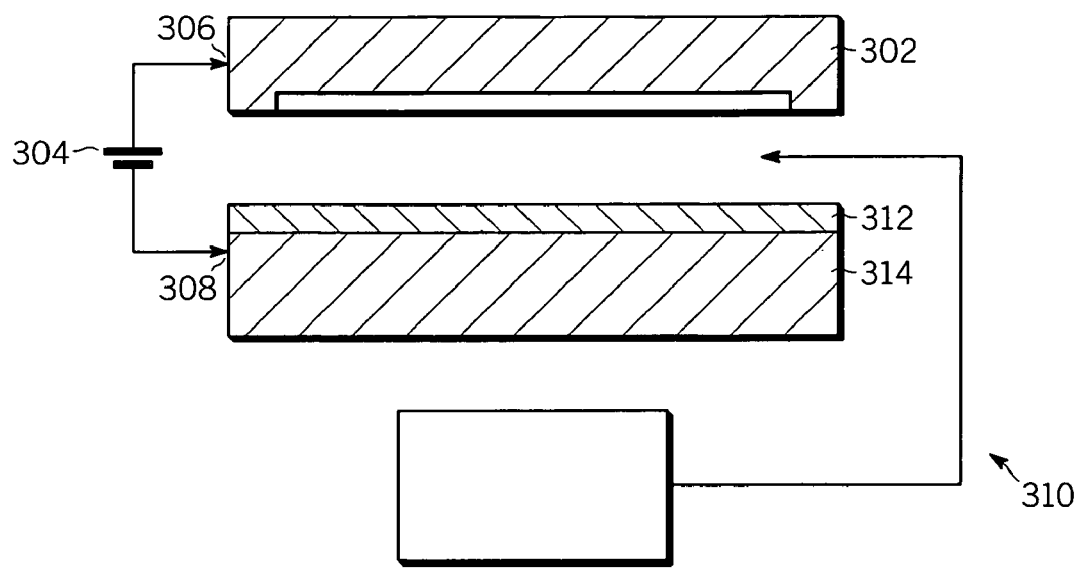
FIG. 3 is a cross-sectional view of a simplified conventional electrochemical polishing station.

FIG. 3 is a cross section of a conventional polishing station 300 capable of electrochemical planarization that may be implemented into planarization apparatus 100. Polishing station 300 includes a wafer carrier 302, source of potential 304, an anode 306, a cathode 308, an electrochemical polishing composition delivery assembly 310, a polishing surface 312, and a platen 314. Source of potential 304 is electrically coupled to anode 306 and configured to apply a positive potential thereto. In one example, anode 306 may conduct the positive potential through the wafer carrier 302 to thereby allow the work piece to act as an anode. Source of potential 304 is also coupled to cathode 308 and provides a negative potential thereto. Electrochemical polishing composition delivery assembly 310 delivers electrochemical polishing composition to the work piece in any known manner. Polishing surface 312 is coupled to platen 314, which may be configured to impart pressure on a surface of a work piece to facilitate mechanical planarization of the work piece. Polishing surface 312 and platen 314 may be configured to cooperate with electrochemical polishing composition delivery assembly 310 to deliver electrochemical polishing composition to the work piece.

Figure 5:
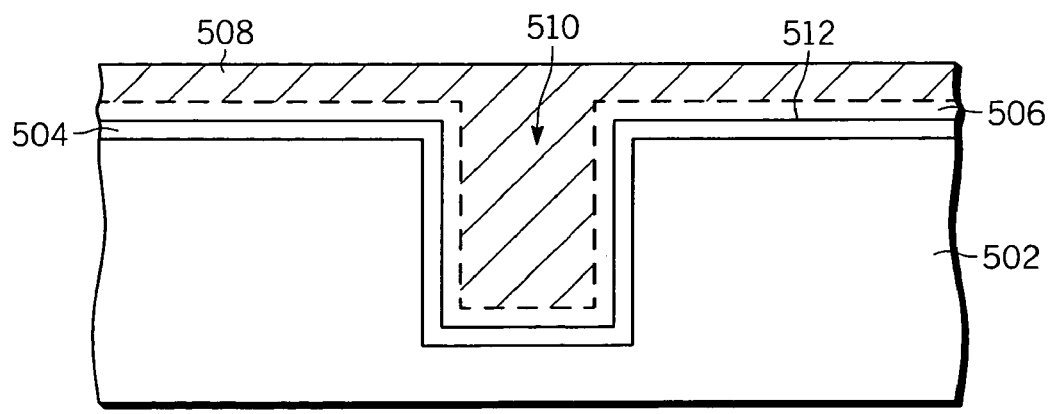
FIG. 5 is a cross section of a conventional work piece that may be processed in the polishing station depicted in FIG. 1.
Figure 4:
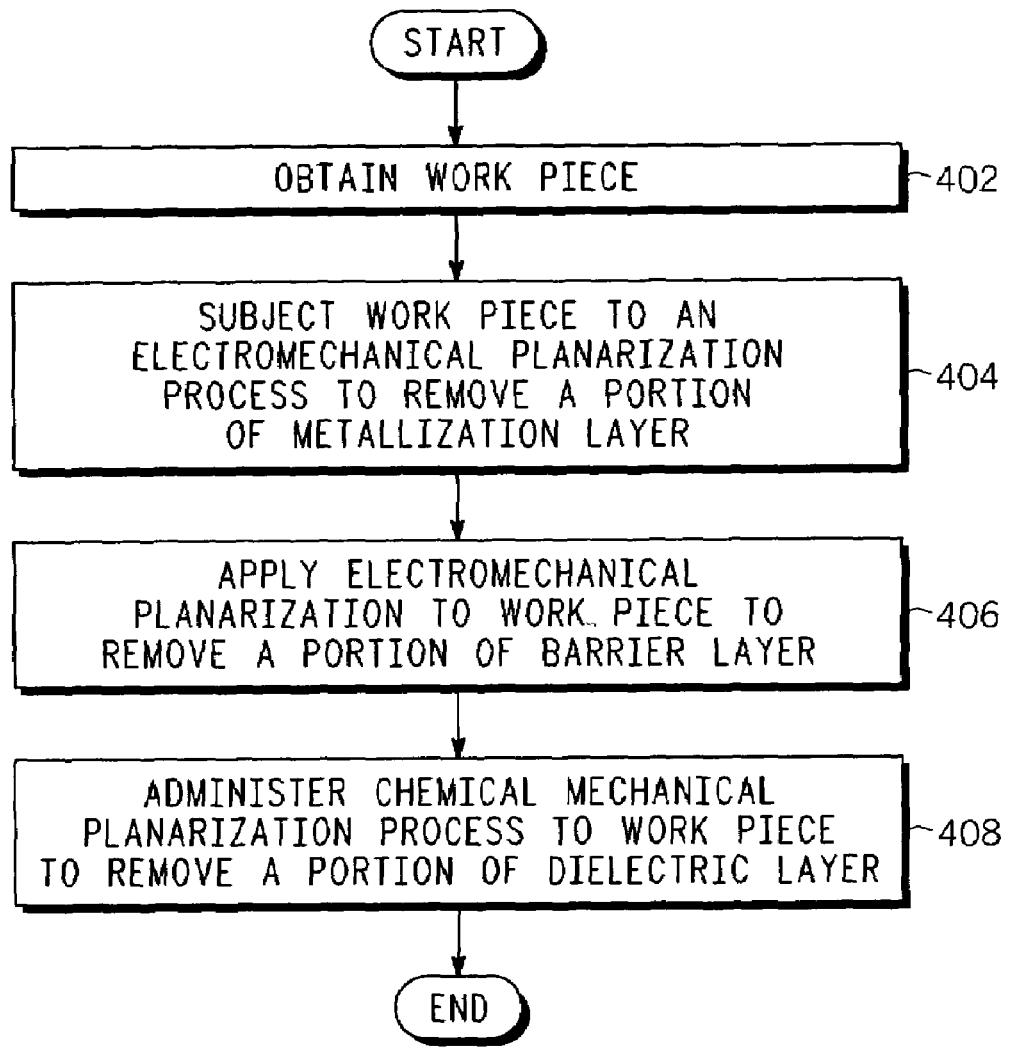
FIG. 4 is a flow diagram illustrating an exemplary embodiment of a method for utilizing the planarization apparatus illustrated in FIG. 1.

In accordance with an exemplary embodiment of the present invention, a method 400 for utilizing apparatus 100 for the removal of the various layers of a work piece is illustrated in FIG. 4. First, the work piece is disposed within a polishing station of apparatus 100, such as polishing station 300 of FIG. 3 (step 402). The work piece may be any one of numerous conventional semiconductor wafers having a surface needing planarization. FIG. 5 shows a cross section of a work piece 500 that may be subjected to one or more planarization processes in accordance with an exemplary embodiment of the present invention. Work piece 500 may include a dielectric layer 502, a barrier layer 504, a seed layer 506, and a metallization layer 508. Each of barrier layer 504, seed layer 506, and metallization layer 508 may be deposited within a trench 510 formed in dielectric layer 502 and each of the various layers may be overdeposited on a surface 512 of work piece 500. Dielectric layer 502 may comprise any one of numerous insulating materials, such as $SiO_2$, $SiOCH_3$ etc. Barrier layer 504 may comprise any conventional material, such as, for example, Ta, TaN, a combination of both (Ta/TaN), or any other appropriate material such as transition metals. Both seed layer 506 and metallization layer 508 are made of conductive material, such as copper, alloys thereof, aluminum, and the like.

Returning to FIG. 4, after work piece 500 is disposed within polishing station 300, it is subjected to a first electrochemical planarization process to remove a portion of metallization layer 508 (step 404). Then, a second electrochemical planarization process is applied to work piece 500 to remove a portion of a barrier layer 504 (step 406). Next, a chemical mechanical planarization process is administered to work piece 500 to remove a portion of dielectric layer 502 (step 408).

Figure 6:
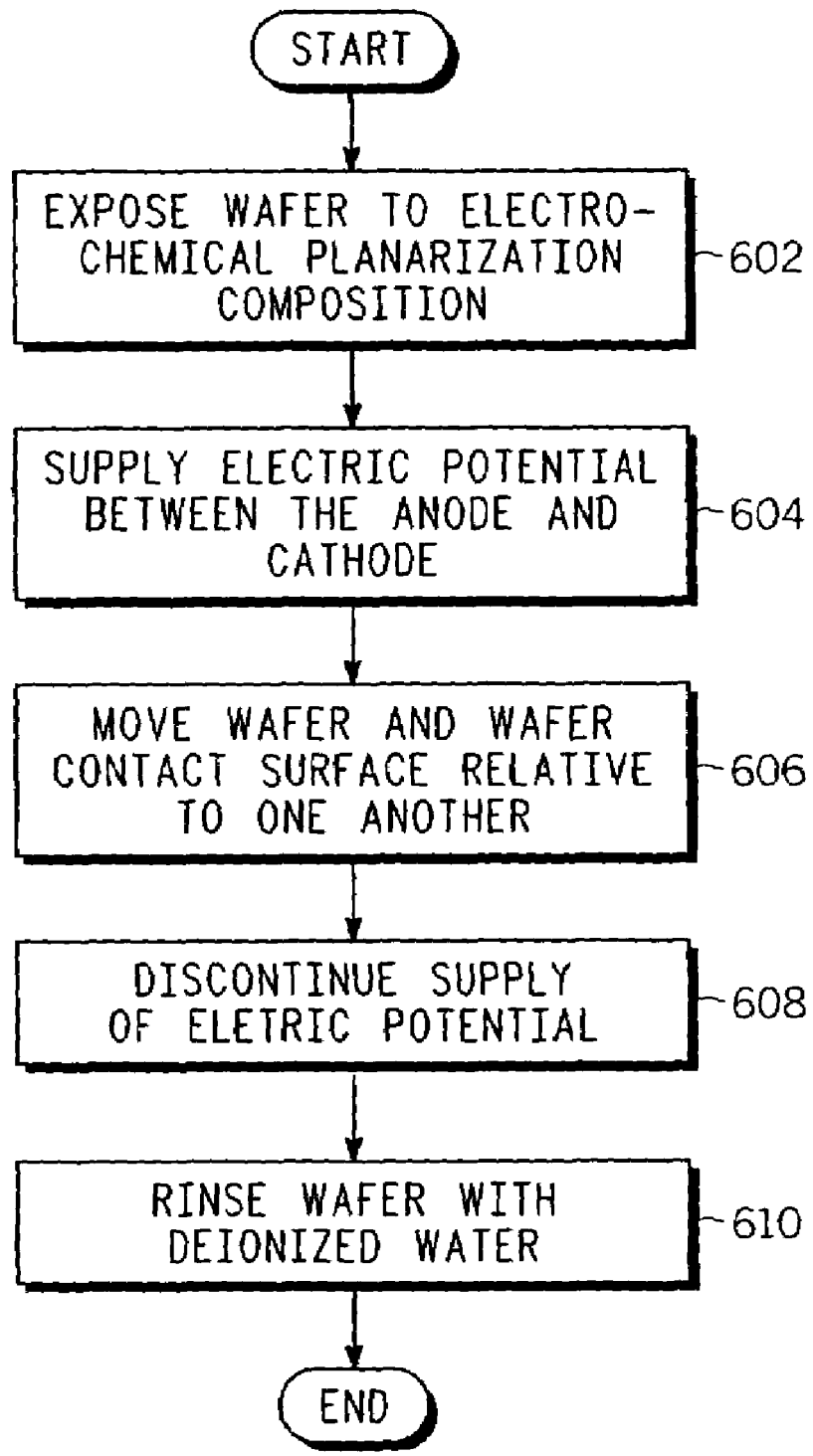
FIG. 6 is a flow diagram illustrating an exemplary step of the method depicted in FIG. 4.

Step 404 is used to planarize metallization layer 508 and remove the overdeposition of layer 508 from surface 512 of work piece 500 and may be performed in any one of numerous conventional manners. One exemplary embodiment of step 402 in which station 300 is employed is shown in FIG. 6 as process 600. Work piece 500 is exposed to a first electrochemical planarization composition for removing metallization layer material 508 (step 602). An electric potential is supplied between anode 306 and cathode 308 to thereby remove at least a portion of metallization layer 508 from work piece 500 (step 604). Work piece 500 and polishing surface 312 are urged against and moved relative to one another (step 606). Next, the electric potential to anode 306 and cathode 308 is discontinued (step 608). Then, work piece 500 is rinsed with deionized water (step 610).

As described above, work piece 500 is exposed to a first electrochemical planarization composition (step 602). This may occur by any one of numerous conventional techniques. For example, the first electrochemical planarization composition may be deposited directly onto work piece 500. Alternatively, the first electrochemical planarization composition may be delivered to work piece 500 through polishing surface 312, by a conduit or any suitable application mechanism. The first electrochemical planarization composition is formulated to remove material from metallization layer 508. In this regard, any suitable electrochemical planarization composition may be employed.

Before, during, or after commencement of the exposure of work piece 500 to the electrochemical planarization composition, an electric potential is supplied between anode 306 and cathode 308 (step 604). This step includes contacting work piece 500 to anode 306 and providing electric potential to anode 306 and cathode 308. Work piece 500 may be contacted to anode 306 using any conventional manner. Alternatively, work piece 500 may be coupled to source of potential 302 to thereby act as an anode. The electric potential is provided such that a positive bias is created between anode 306 and cathode 308. Source of potential 302 provides a current to work piece 500 and conductive member 318 in any manner and in any amount. For example, the current may be provided in a modulated manner. A modulated electric potential may mechanically abrade a passivation layer that may deposit over metallization layer 508 during a higher electric pulse, whereas readsorption of corrosion inhibitor that may be present in the first electrochemical planarization composition and repassivation of metallization layer 508 may occur during a lower or zero electric pulse to create a smooth, planar surface. In another example, the current is provided in a continuous manner. A continuous electric potential may create a passivation layer having a thickness that forms at a rate that is similar to the rate of removal. The electric potential may be supplied in a range of between about 1 V and about 20 V, more preferably between about 5V and about 10V.

It will be appreciated that step 602 and step 604 may occur in any sequence. For example, the current may first be supplied between anode 306 and cathode 308. Then the first electrochemical planarization composition may be contacted to work piece 500. In this process sequence, current flows through work piece 500 once the composition contacts work piece 500 for an "active entry". Alternatively, first, work piece 500, is contacted with the electrochemical planarization composition, and then an electric potential is supplied between work piece 500 and cathode 308 for a "passive entry".

Next, work piece 500 may be urged against polishing surface 312 and the two may be moved relative to one another, step 606. In one exemplary embodiment, work piece 500 is urged against polishing surface 312, which is orbited at an orbital velocity in a range of between about 10 to about 800 rpm. In another exemplary embodiment, work piece 500 is rotated at velocities of between about 2 to about 50 rpm, while in contact with polishing surface 312. In yet another exemplary embodiment, a down force pressure of between about 0.1 to about 1.0 psi is applied to work piece 500. Work piece 500 and polishing surface 312 may be moved relative to one another in any manner, such as, for example, in a linear motion, orbital motion, circular motion, or any combination thereof.

After a desired amount of metallization layer 508 is removed from work piece 500, the supply of electric potential to anode 306 and cathode 308 is discontinued (step 608), and work piece 500 may be rinsed with deionized water (step 610). It will be appreciated that work piece 500 may be removed from contact with anode 306 and transferred to another section of apparatus 300 for delivery of the deionized water.

In an alternative embodiment of the present invention, step 404 may be an ECMP process. In an ECMP process, polishing surface 312 is urged against workpiece 500 at a pressure sufficient to perform mechanical planarization of workpiece 500 in addition to the electrochemical planarization of work piece 500. In such case, method 600 may still be applied. However, the speed at which work piece 500 is rotated and the pressure at which work piece 500 and the wafer contact surface are urged against one another may be different than those stated above in step 606. For example, for an ECMP process, work piece 500 may be rotated at a speed of between about 10 rpm and about 300 rpm, while a pressure of between about 0.01 psi and about 0.6 psi is applied between work piece 500 and polishing surface 312.

In another exemplary embodiment of the present invention, a conventional chemical mechanical planarization process may be performed on metallization layer 508 after step 404, to remove excess material from the overdeposition of metallization layer 508 after metallization layer 508 has been planarized. Any conventional chemical mechanical pIlanarization process and any conventional CMP apparatus may be used. In one exemplary embodiment of the present invention, CMP apparatus 200 is used and platen 206 rotates work piece 500 at a speed of between about 5 rpm and about 1200 rpm, more preferably about 200 rpm. Work piece 500 and polishing surface 204 are urged against one another at a pressure of between about 0.01 psi and about 2 psi, more preferably about 1 psi.

After the overdeposition of metallization layer 508 is removed, or at least substantially removed from surface 512 of work piece 500, an electrochemical planarization process is applied to work piece 500 to remove the overdeposition of barrier layer 504 (step 404). Material from barrier layer 504 is removed in substantially the same manner as described above, for example, by the processes shown in FIG. 6. Alternatively, any other suitable process may be administered in this step. However, here, a second electrochemical planarization composition is used, and the speed at which work piece 500 is rotated, the pressure at which work piece 500 and polishing surface 312 are urged against one another, and the electric potential supplied between anode 306 and cathode 308 may be different than those used in method 600.

The second electrochemical planarization composition is formulated to remove material from barrier layer 504, while protecting seed layer 506 and metallization layer 508. According to an exemplary embodiment of the present invention, the second electrochemical planarization composition comprises a suitable complexing agent capable of complexing with material from barrier layer 504 at a pH outside of a pH range of greater than about pH 2 and less than about pH 10, a plurality of abrasive particles, a corrosion inhibitor, and a pH and ionic strength adjusting agent. In an alternate embodiment of the present invention, the second electrochemical planarization composition may further comprise an accelerator and/or an oxidizing agent.

According to one exemplary embodiment of the present invention, the barrier layer material may comprise tantalum (e.g. tantalum, tantalum nitride, or tantalum/tantalum nitride (Ta/TaN)) and the second electrochemical planarization composition is formulated to remove tantalum from barrier layer 504, while a pressure of less than about 1 psi and an electric potential of less than about 10V are applied to work piece 500. In this regard, a complexing agent may be utilized that is capable of complexing with tantalum to form a tantalum species. In accordance with one exemplary embodiment of the present invention, the complexing agent may be capable of operating at a pH of about 2 or less to remove tantalum from barrier layer 504 as a tantalum oxide cation, $TaO_2^{+1}$. The tantalum oxide cation is soluble and, thus, is removed from barrier layer 504 as a soluble tantalum-complex. Examples of suitable complexing agents include, but are not limited to any one or more of sulfuric acid, sulfonic acid (e.g. 2,3,4-trihydroxybenzenesulfonic acid), benzoic acid (e.g. 2,6-dibromo-3,4,5-trihydroxybenzoic acid), oxalic acid, tartaric acid (e.g. D-tartaric), ethyenediaminetetraacetic acid ("EDTA").

In accordance with another exemplary embodiment of the present invention, the complexing agent may be capable of operating at a pH about 10 or greater to remove tantalum from barrier layer 504 as a tantalate. Specifically, the complexing agent causes the tantalum to corrode and be removed as a $TaO_3^-$ ionic species. Examples of suitable complexing agents include, but are not limited to EDTA, and hydroxide ion.

The complexing agent may be present in the second electrochemical planarization composition at a concentration of between about 0.001 and about 5 percent by weight. Preferably, the electrochemical planarization composition includes about 0.1 and about 1 percent by weight of complexing agent. It will be appreciated, however, that the particular concentration of the complexing agent may be dependent on the relative concentrations of the other constituents of the electrochemical planarization composition and the particular complexing agent selected.

According to another exemplary embodiment of the present invention, the second electrochemical planarization composition may include abrasive particles. The abrasive particles have a Mohs hardness in the range of about 5 to about 9, preferably in the range of about 6 to about 7, and a particle size in the range of about 20 nms to about 2 microns. As used herein, "particle size" refers to the average size (the size is the average diameter of an abrasive particle) of the plurality of abrasive particles. The second electrochemical planarization composition of the present invention may comprise abrasive particles such as, for example, silica (Mohs hardness of approximately 6.5), titania (Mohs hardness of approximately 5.5 to 6.5), zirconia (Mohs hardness of approximately 6.5), alumina (Mohs hardness of approximately 9) or a combination thereof. In a preferred embodiment of the invention, the abrasive particles may be formed of fumed silica. Further, the abrasive particles form a stable colloid with the dispersing medium, that is, the abrasive particles do not exhibit substantial agglomeration or coagulation and do not readily settle out of solution. The concentration of the abrasive particles may be in the range of about 1% by weight to about 50% by weight of the electrochemical planarization composition.

In another exemplary embodiment of the present invention, the second electrochemical planarization composition includes a corrosion inhibitor. The corrosion inhibitor is included to protect seed layer 306 or metallization layer 308 by adsorbing thereon to prevent removal of the seed layer and/or metallization layer materials while barrier layer material is being removed. The corrosion inhibitor may be included in any appropriate concentration. In one exemplary embodiment, the second electrochemical planarization composition includes between about 0.25% to about 0.3% by weight of the corrosion inhibitor; however, it will be appreciated that the particular concentration may depend on the particular corrosion inhibitor used. Any one of numerous conventionally used corrosion inhibitors may be used, including but not limited to benzotriazole, 5-aminotetrazole, 1,2,4-triazole, and imidazole.

In still yet another exemplary embodiment of the present invention, the second electrochemical planarization composition also includes a pH and ionic strength adjusting agent to maintain the composition at the desired pH. Preferably, a pH and ionic strength adjusting agent capable of adjusting pH and ionic strength of the second electrochemical planarization composition is employed and is present in the second electrochemical planarization composition in any suitable concentration. For example, the pH and ionic strength adjusting agent may be present in a concentration in the range of between about __0.01_% and about __10_%. Suitable pH and ionic strength adjusting agent include, but are not limited to sulfinuric acid, potassium hydroxide, tetramethylammonium hydroxide, and the like. Any appropriate concentration of pH and ionic strength adjusting agent may be used in order to adjust the pH of the second electrochemical planarization composition to a desired pH.

In another exemplary embodiment of the present invention, a corrosion accelerator may be included. The corrosion accelerator promotes the oxidation of less noble metals when present in the second electrochemical planarization composition. Any one of numerous suitable accelerators may be employed, such as, for instance, any salt of a noble metal or any salt of metals higher in the electrochemical series. For example, when metallization layer 508 and/or seed layer 506 comprise copper, a variety of copper salts may be utilized as corrosion accelerators in the second electrochemical planarization composition. Because copper and barrier layer material, such as Ta/TaN, have different standard reduction potentials, it is believed by the inventor that when copper and Ta/TaN are exposed to the same electrochemical planarization composition, the copper will reduce, while Ta/TaN will oxidize. The presence of copper salts promotes and accelerates Ta/TaN oxidation and copper reduction to thereby protect the metallization layer 508 and/or seed layer 506. Some suitable corrosion accelerators, include, for example, copper sulfates, copper acetates, copper fluoroborate, and cupric nitrates. A corrosion accelerator may be suitably present in a relatively wide concentration range in the electrochemical planarization composition. Preferably, a copper salt will be employed at a concentration of from about 0.001% to about 10% by weight of the second electrochemical planarization composition.

In another exemplary embodiment of the present invention, the second electrochemical planarization composition may include an oxidizing agent. The oxidizing agent may be used to cause the tantalates that are removed from barrier layer 504 to oxidize and form soluble pertantalates. The oxidizing agent may be, for example, a peroxide. Examples of suitable oxidizing agents include hydrogen peroxide ($H_2O_2$), peroxysulfuric acid (or persulfuric acid), periodic acid ($HIO_4$ or $H_5IO_2$), monopersulfates ($SO_5^{2-}$), dipersulfates ($S_2O_8^{2-}$), di-tert-butyl peroxide ($C_8H_{18}O_2$) and the like and combinations thereof. In a preferred embodiment of the present invention, the oxidizing agent comprises hydrogen peroxide. The oxidizing agent may be present in the second electrochemical planarization composition at a concentration of between about 0.01% and about 10% by weight.

In another exemplary embodiment of the present invention, the second electrochemical planarization composition may include between about 1% and about 10% by weight of EDTA, between about 0.01 and about 1% by weight of BTA, between about 0.1% and about 5% by weight of abrasive particles, and between about $10^{-4}$ to 10M potassium hydroxide to adjust the pH of the second electrochemical planarization composition to between about 10 to about 14.

In another exemplary embodiment of the present invention, the second electrochemical planarization may include between about 1% and about 5% by weight of sulfuric acid, between about 0.1% and about 5% by weight of copper salts, between about 0.01% and about 1% by weight BTA, and between about 0.1% and 5% by weight of abrasive particles. In still another exemplary embodiment, hydrogen peroxide may be included.

Referring again to FIG. 4, during step 404, the speed at which work piece 500 is rotated is preferably in a range of between about 2 rpm and about 100 rpm, and more preferably between about 2 rpm and about 50 rpm. Additionally, the pressure at which work piece 500 and polishing surface 312 are urged against one another is preferably in a range of between about 0.01 psi and about 2 psi, and more preferably between about 0.1 psi and about 1 psi. Additionally, an electric potential may be supplied in a range of between about 1V and about 20V, more preferably between about 5V and about 10V.

After the overdeposition of barrier layer 504 is removed, a chemical mechanical planarization process is administered to work piece 500 to remove material from dielectric layer 502 (step 408). Any conventional CMP process may be employed. In one exemplary embodiment of step 408, CMP apparatus 200 is utilized and work piece 500 and polishing surface 204 are urged against one another at a pressure of between about 0.1 psi and about 3 psi, more preferably about 1 psi. In another exemplary embodiment of step 408, polishing surface 204 is rotated at a speed of between about 10 rpm and about 800 rpm, more preferably about 200 rpm when contacted with work piece 500.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. An electrochemical planarization composition for removing barrier layer material from a work piece during an electrochemical mechanical polishing process while protecting a metallization layer of the work piece, the electrochemical planarization composition comprising:
    at least one complexing agent capable of complexing with the barrier layer material when exposed to a pH outside of a pH range of greater than about pH 2 and less than about pH 10, the complexing agent comprising a non-oxidizing agent selected from the group consisting of 1,3-dihydroxy-4-(2-pyridylazo) benzene, benzoic acid, 2,3,4-trihydroxybenzenesulfonic acid, and 2,6-dibromo-3,4,5-trihydroxybenzoic acid;
    a corrosion inhibitor;
    abrasive particles; and
    a pH adjuster.

2. The electrochemical planarization composition of claim 1, wherein the barrier layer material comprises tantalum and the complexing agent is capable of complexing with tantalum.

3. The electrochemical planarization composition of claim 2, wherein the complexing agent is capable of complexing with tantalum to produce soluble pertantalates.

4. The electrochemical planarization composition of claim 1, further comprising an oxidizing agent.

5. The electrochemical planarization composition of claim 4, wherein the oxidizing agent comprises an organic or inorganic compound containing a bivalent O—O group.

6. The electrochemical planarization composition of claim 5, wherein the oxidizing agent is selected from a group consisting of at least hydrogen peroxide ($H_2O_2$), peroxysulfuric acid (or persulfuric acid), periodic acid ($HIO_4$ or $H_5IO_2$), monopersulfates ($SO_5^{2-}$), dipersulfates ($S_2O_8^{2-}$), di-tert-butyl peroxide ($C_8H_{18}O_2$) and the like and combinations thereof.

7. The electrochemical planarization composition of claim 1, further comprising a corrosion accelerator.

8. The electrochemical planarization composition of claim 7, wherein the corrosion accelerator comprises a copper salt.

9. The electrochemical planarization composition of claim 1, wherein the electrochemical planarization composition has a pH of greater than about pH 10, the electrochemical planarization composition further comprising:
    between about 1% and about 10% by weight of the complexing agent;
    between about 0.01% and about 1% by weight BTA;
    between about 0.1% and about 5% by weight of abrasive particles;
    potassium hydroxide having a concentration of between about $10^{-4}$ and about 10M.

10. The electrochemical planarization composition of claim 1, wherein the electrochemical planarization composition has a pH of less than about pH 2, the electrochemical planarization composition further comprising:
    between about 1% and about 5% by weight of sulfuric acid;
    between about 0.1 and about 5% by weight of a copper salt;
    between about 0.01% and about 1% by weight BTA;
    between about 0.1% and about 5% by weight of abrasive particles; and
    potassium hydroxide having a concentration of between about $10^{-4}$ and about 10M.

* * * * *